(12) United States Patent
Moceri et al.

(10) Patent No.: US 10,910,134 B2
(45) Date of Patent: Feb. 2, 2021

(54) ELECTRICAL DEVICE COMPRISING AN INSULATING FILM

(71) Applicant: Valeo Siemens eAutomotive France SAS, Cergy (FR)

(72) Inventors: Alwin Moceri, Conflans Sainte Honorine (FR); Eloi Mortain, Suresnes (FR); Baptiste Parigot, Croissy-sur-Seine (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 16/713,305

(22) Filed: Dec. 13, 2019

(65) Prior Publication Data
US 2020/0194146 A1 Jun. 18, 2020

(30) Foreign Application Priority Data
Dec. 14, 2018 (FR) ...................................... 18 72980

(51) Int. Cl.
| H01B 17/56 | (2006.01) |
| B60L 50/51 | (2019.01) |
| H02K 11/33 | (2016.01) |
| H01R 25/16 | (2006.01) |
| H05K 5/02 | (2006.01) |

(Continued)

(52) U.S. Cl.
CPC .............. *H01B 17/56* (2013.01); *B60L 50/51* (2019.02); *H01R 25/161* (2013.01); *H05K 5/0217* (2013.01); *H05K 5/0247* (2013.01); B60L 2210/10 (2013.01); B60L 2210/40 (2013.01); H01R 2201/26 (2013.01);

(Continued)

(58) Field of Classification Search
CPC ..... H01B 17/56; H01B 2201/26; B60L 50/51; B60L 2210/10; H01R 25/161; H01R 2201/26; H05K 5/0217; H05K 5/0247; H02K 11/33
USPC .......................................................... 174/520
See application file for complete search history.

(56) References Cited

U.S. PATENT DOCUMENTS

| 5,132,896 A | 7/1992 | Nishizawa et al. |
| 5,422,440 A | 6/1995 | Palma |

(Continued)

FOREIGN PATENT DOCUMENTS

| EP | 1174992 A2 | 1/2002 |
| EP | 1788596 A1 | 5/2007 |
| EP | 2928059 A1 | 10/2015 |

OTHER PUBLICATIONS

French Search Report for Application No. 1872980 dated Oct. 9, 2019.

*Primary Examiner* — Timothy J Thompson
*Assistant Examiner* — Michael F McAllister
(74) *Attorney, Agent, or Firm* — McCormick, Paulding & Huber PLLC

(57) ABSTRACT

The object of the invention is an electrical device comprising:
  a housing comprising a cavity receiving an electronic component, and
  at least one first electrical conductor connected to the electronic component so as to supply it with electric power,
said electrical device being characterised in that it comprises a first electrically insulating film being against a surface of the first conductor so as to electrically insulate it, said first insulating film having at least one (Continued)

holding member enabling the first insulating film to be attached to a mechanical element, in particular of the electrical device.

20 Claims, 7 Drawing Sheets

(51) Int. Cl.
  *H02K 5/22* (2006.01)
  *H02K 7/00* (2006.01)
  *H02K 11/00* (2016.01)
(52) U.S. Cl.
  CPC ............. *H02K 5/225* (2013.01); *H02K 7/006* (2013.01); *H02K 11/0094* (2013.01); *H02K 11/33* (2016.01)

(56) References Cited

U.S. PATENT DOCUMENTS

| | | | | |
|---|---|---|---|---|
| 10,109,422 | B2* | 10/2018 | Koyama | H01G 4/002 |
| 2006/0232942 | A1* | 10/2006 | Nakatsu | B60L 50/16 |
| | | | | 361/710 |
| 2009/0059467 | A1* | 3/2009 | Grimm | H01G 4/224 |
| | | | | 361/301.5 |
| 2011/0102966 | A1* | 5/2011 | Takeoka | H01G 4/38 |
| | | | | 361/301.3 |
| 2011/0304948 | A1 | 12/2011 | Lee et al. | |
| 2014/0321090 | A1* | 10/2014 | Guerin | H01G 9/26 |
| | | | | 361/782 |
| 2015/0155692 | A1 | 6/2015 | Hwang et al. | |
| 2018/0358903 | A1* | 12/2018 | Takahashi | H02M 7/5387 |

* cited by examiner

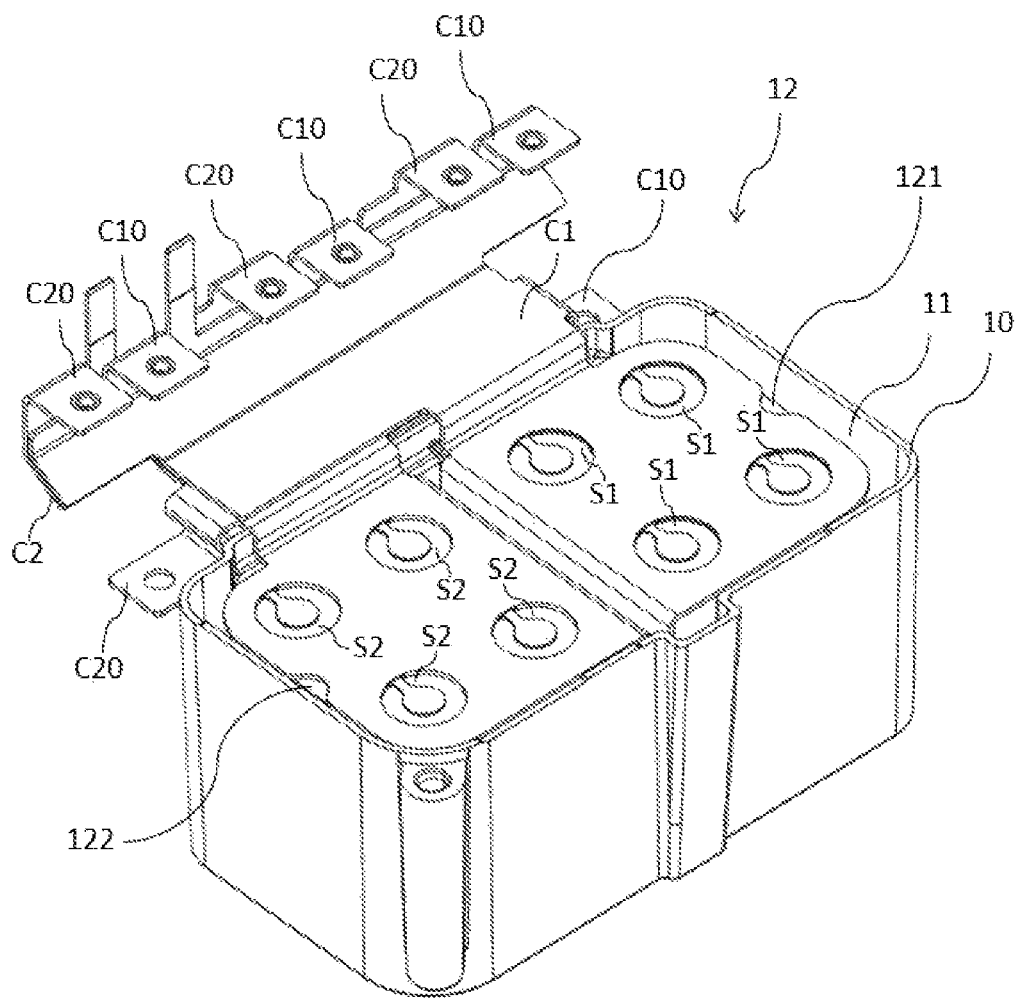
[Fig. 1]

[Fig. 2]
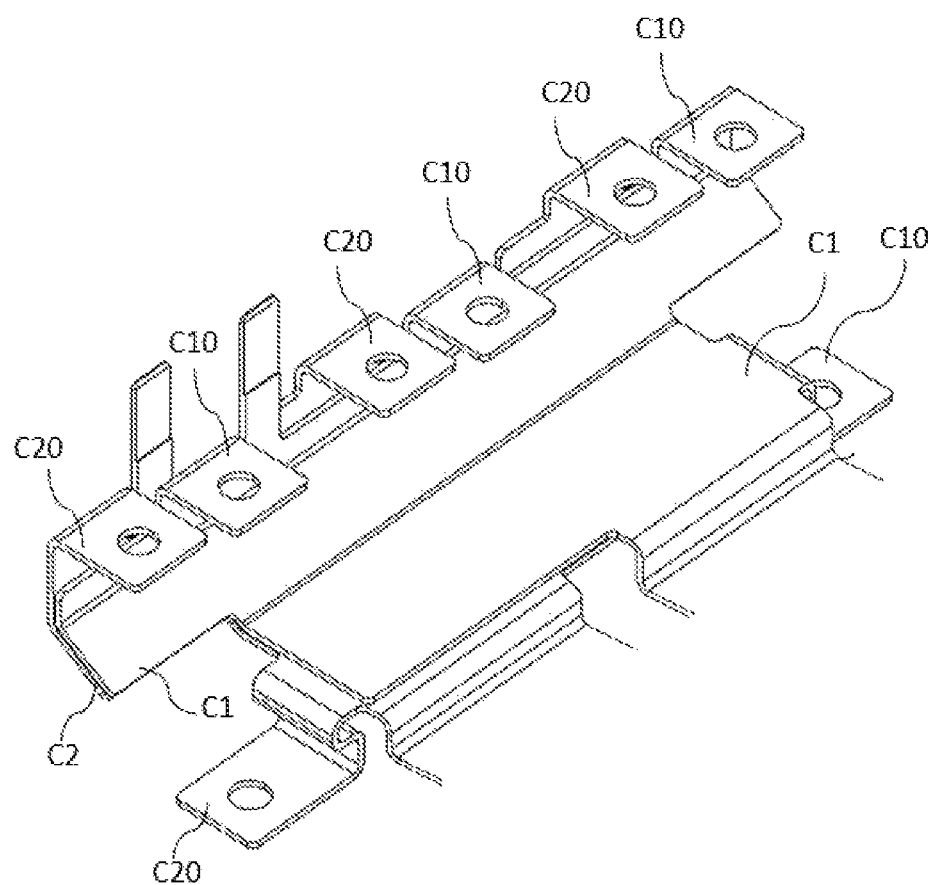

[Fig. 3]
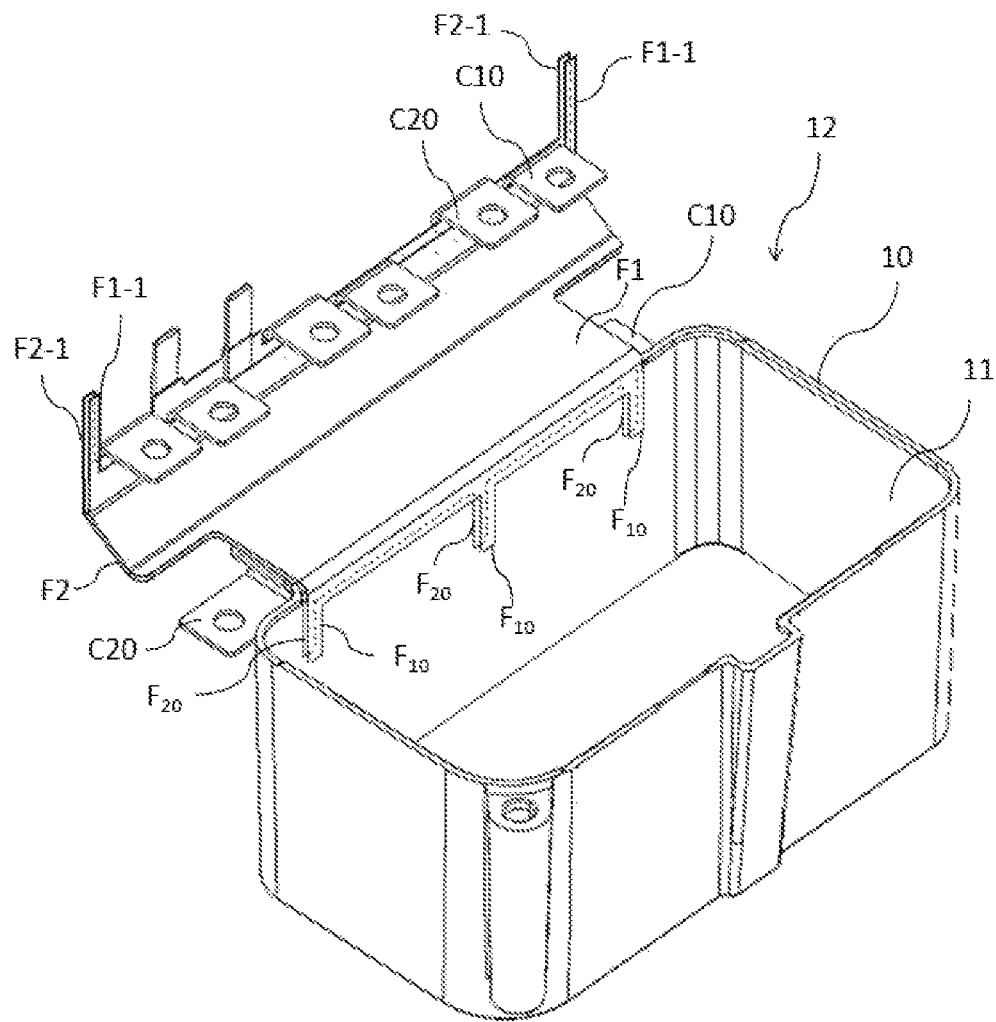

[Fig. 4]
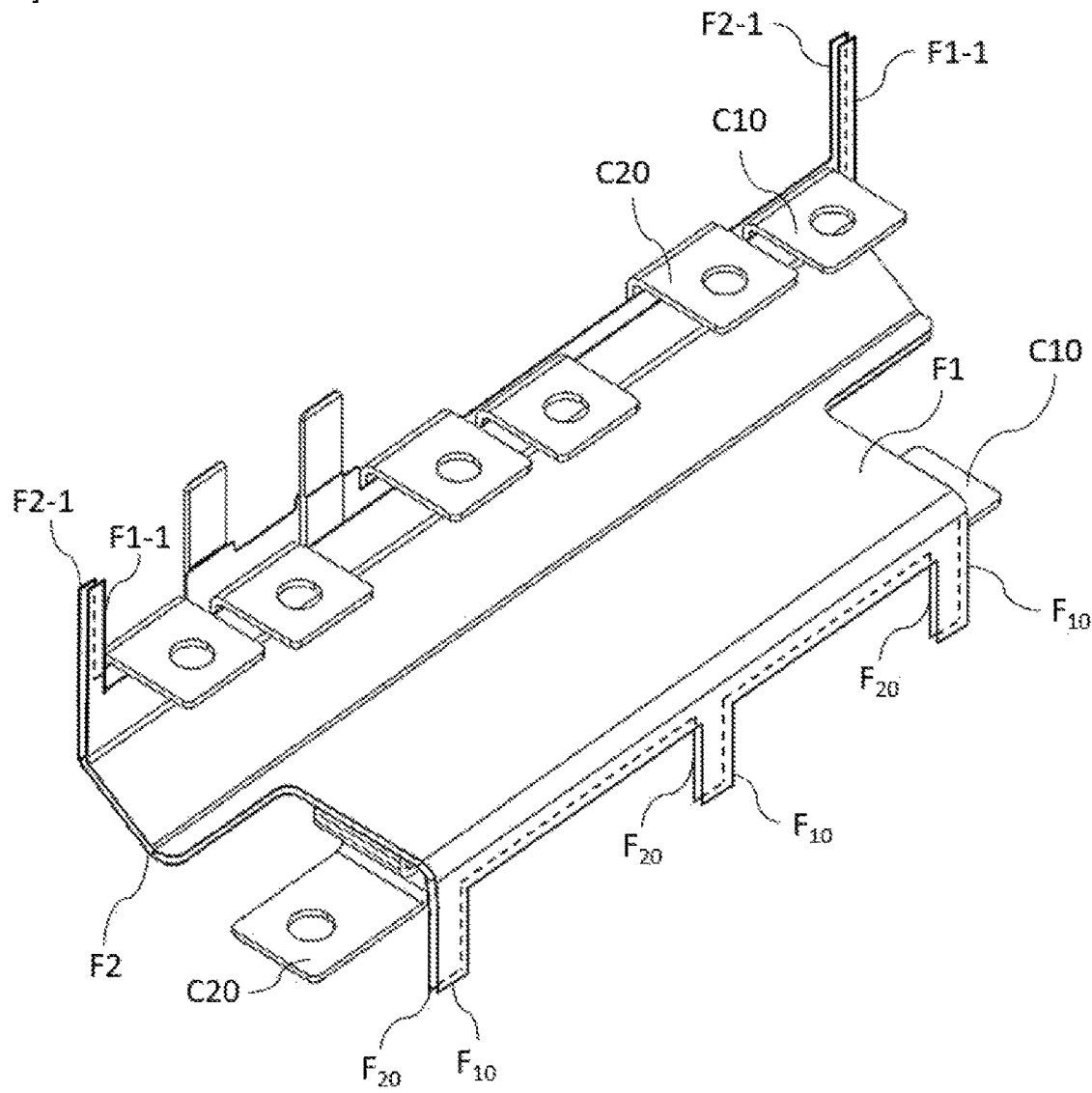

[Fig. 5]
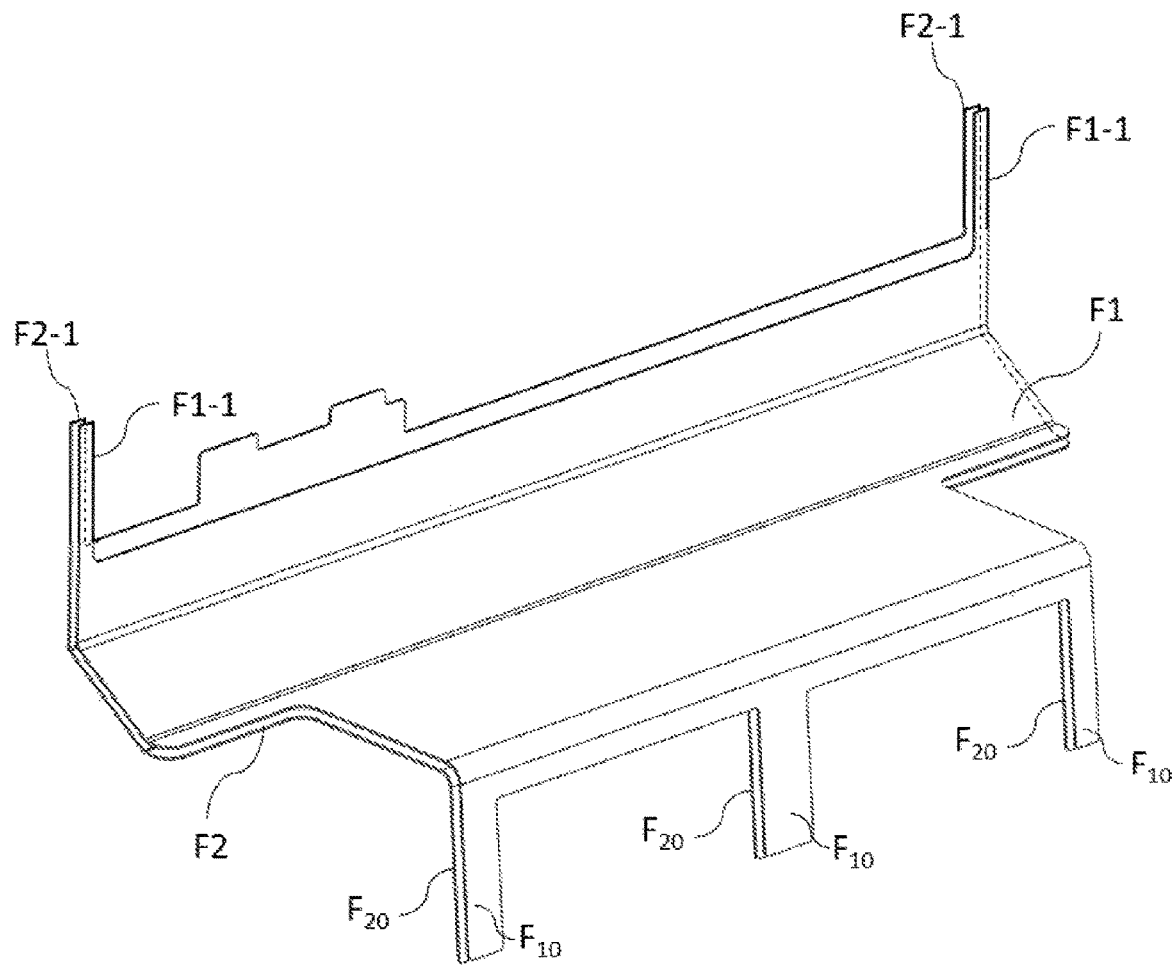

[Fig. 6]
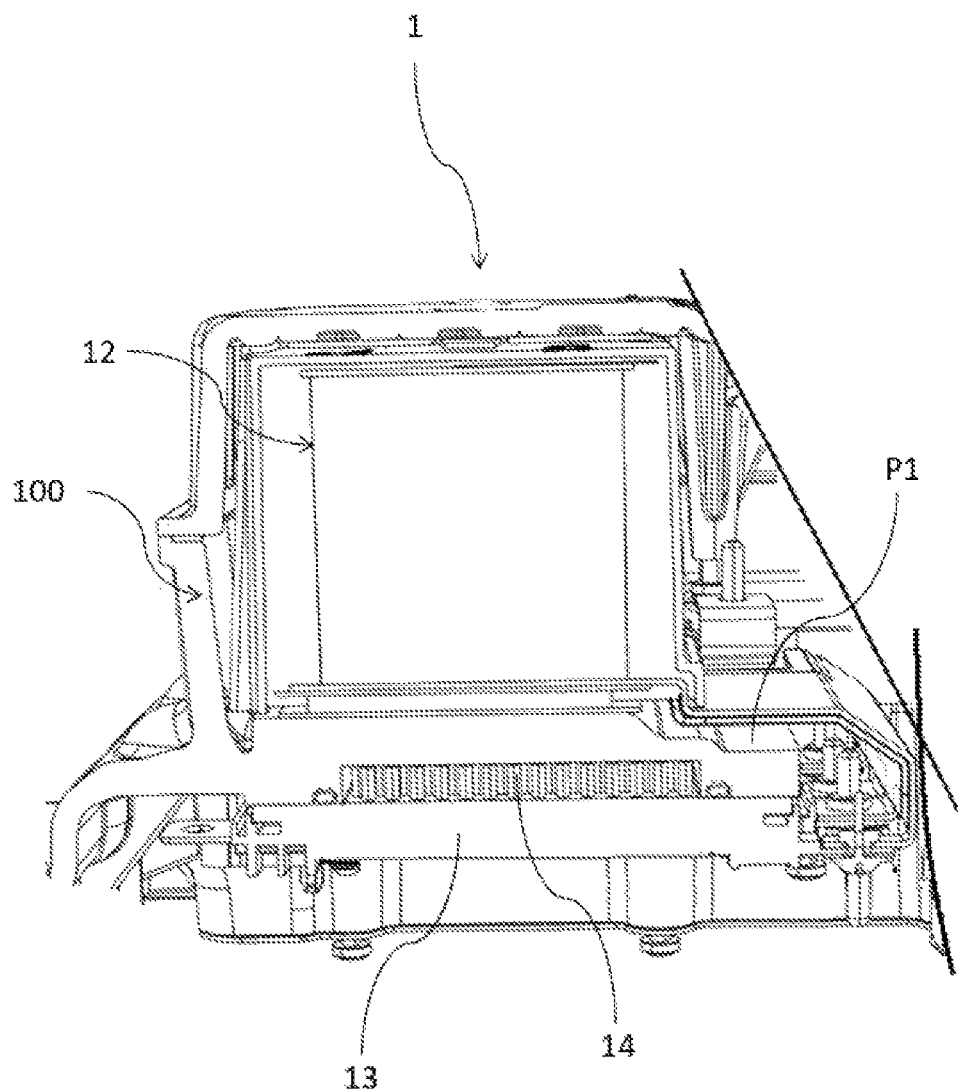

[Fig. 7]
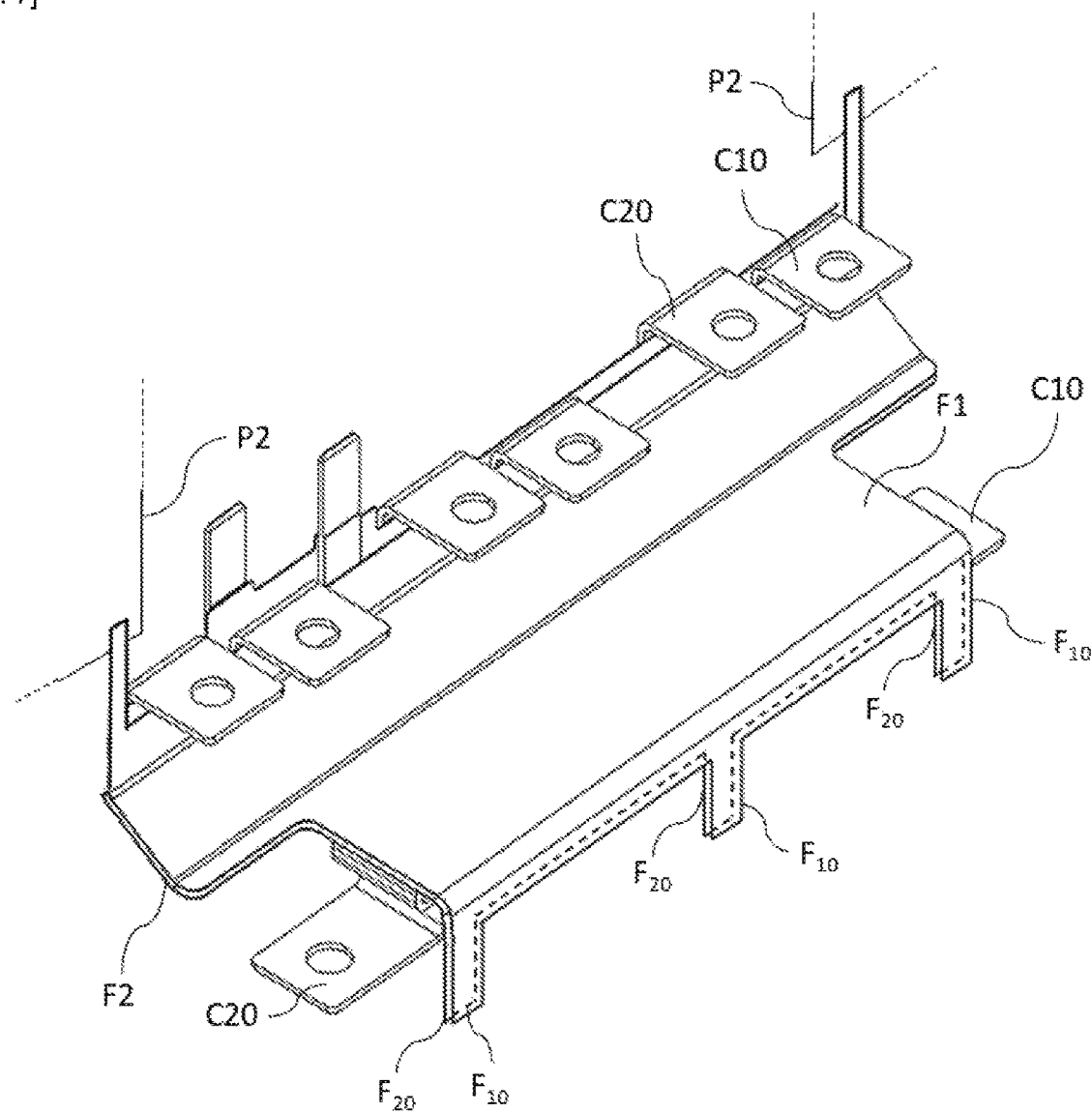

ELECTRICAL DEVICE COMPRISING AN INSULATING FILM

CROSS-REFERENCE TO RELATED APPLICATION

This application claims foreign priority benefits under 35 U.S.C. § 119 to French Patent Application No. 1872980 filed on Dec. 14, 2018, the content of which is hereby incorporated by reference in its entirety.

TECHNICAL FIELD

The present invention relates to an electrical device having an improved electrical insulation system and an electrical equipment comprising such an electrical device, in particular a voltage converter, or an electrical charger or a power inverter.

The electrical equipment is in particular for an electric or hybrid vehicle.

The invention aims in particular at allowing a durable electrical insulation for such electrical devices.

BACKGROUND

As is known, in an electrical or hybrid automobile vehicle, a high voltage power battery provides an electrical power supply function of an electric motor system allowing vehicle drive. More precisely, in order to control the electric machine driving the vehicle wheels, it is known to use a power inverter enabling the DC current provided by the high voltage power battery to be converted into one or more AC, for example sinusoidal control currents.

In addition, in order to be charged, the high voltage power battery is for example connected to an external electric power grid, in particular via an onboard electrical charger comprising in particular at least one DC-DC voltage converter.

The power inverter comprises a housing, dedicated to this equipment. The power inverter also comprises a capacitive block comprising a casing adapted to be inserted in the housing of the power inverter. The capacitive block also comprises a cavity, located inside the casing, and a smoothing capacitor, adapted to be inserted in the cavity of the casing. The capacitive block enables the DC current provided by the power battery to be smoothed, before being converted into an AC control current. This capacitor thus enables residual disturbances of the DC current to be removed in order to be able to be filtered and converted into an AC control current.

The capacitive block also comprises at least two conductors, in particular a conductor connected to the negative terminal of the capacitor and a conductor connected to the positive terminal of the capacitor. Each conductor is in the form of a folded copper foil for example. These conductors thus make it possible to give simple access to the negative and positive terminals of the capacitor, in order to simply connect the capacitor to the rest of the system.

However, the conductors are disposed along distinct parallel planes, yet being in proximity of each other. Thus, an insulation should be made between the conductors and also between the conductors and the housing in order to insulate these elements from each other in order to avoid any short-circuit risk that can prevent the power inverter from optimally operating.

According to the state of the art, a first solution consists in using a first insulating film to be placed between the conductors and the housing and a second insulating film to be placed between the conductors. According to this solution, the first and the second insulating film are held stationary by attaching them in particular with an adhesive material, such as glue.

However, an adhesive material can have a limited lifetime or even being much lower than the lifetime of a vehicle. Therefore, it is possible that the adhesive material deteriorates over time and that short-circuit problems occur.

Thus, there is a need for an efficient and durable solution of a system of attaching insulation elements of different elements of an electrical equipment, in particular of a capacitive block.

SUMMARY

More precisely, the object of the invention is an electrical device comprising:
 a casing comprising a cavity receiving an electronic component, and
 at least one first electrical conductor connected to the electronic component so as to supply it with electric power,
  said electrical device being remarkable in that it comprises a first electrically insulating film being against a surface of the first conductor so as to electrically insulate it, said first insulating film having at least one holding member enabling the first insulating film to be attached to a mechanical element, in particular of the electrical device.

Advantageously, the electrical device comprises a second electrical conductor connected to the electronic component so as to supply it with electric power, the first and second electrical conductors being superimposed with each other and extending along two distinct parallel planes, and wherein the mechanical element is a second insulating film positioned between the conductors so as to insulate the first and the second conductor from each other.

Preferably, the second insulating film of the electrical device comprises at least one holding member adapted to be attached to the holding member of the first insulating film.

Preferably, the second insulating film of the electrical device has at least one protrusion inserting in the cavity of the casing to be embedded in a filling material of the cavity of the casing, said protrusion being located at an opposite edge of the second insulating film with respect to the holding member.

Preferably, the first insulating film of the electrical device has at least one protrusion inserting in the cavity of the casing to be embedded in a filling material of the cavity of the casing, said protrusion being located at an opposite edge of the first insulating film with respect to the holding member.

Advantageously, the first insulating film of the electrical device is of plastics.

According to one embodiment, the first insulating film of the electrical device is held by a first mechanical means, for example an adhesive material, against the surface of the first conductor and by a second mechanical means with a different nature, for example by welding, on the mechanical element.

According to another embodiment, the first insulating film of the electrical device has at least one fold so as to fit in the surface of the first conductor and is held against said surface of the first conductor only by the first holding member and by the protrusion of said first insulating film.

The invention also relates to an electrical equipment comprising a housing and an electrical device, housed in said housing, in which electrical equipment, said first insulating film is configured to electrically insulate the first conductor from a wall of said housing of the electrical equipment or other components of the electrical equipment located in said housing of the electrical equipment, said second electrically insulating film being configured to insulate the conductors from each other.

Advantageously, the electrical equipment is configured to be onboard a vehicle, and forming a power inverter configured so as to supply an electric motor driving the vehicle from a battery, or a DC-DC converter configured to convert a voltage between a high voltage power battery and a low voltage power battery, or an electrical charger configured to convert a voltage between an electric power grid external to the vehicle and a battery of the vehicle.

BRIEF DESCRIPTION OF THE DRAWINGS

The invention will be better understood upon reading the description that follows, only given by way of example, and referring to the appended drawings given by way of non-limiting examples, in which identical references are given to similar objects and in which:

FIG. 1 illustrates the scheme of a capacitive block;

FIG. 2 schematically illustrates the scheme of the conductors of the capacitive block illustrated in FIG. 1;

FIG. 3 represents the scheme of the casing of the capacitive block according to FIG. 1 and insulating films according to one embodiment of the invention;

FIG. 4 represents the scheme of the conductors of the capacitive block illustrated in FIG. 1 and of insulating films according to one embodiment of the invention;

FIG. 5 represents the insulating films only according to one embodiment of the invention;

FIG. 6 illustrates the scheme of an electrical equipment according to one embodiment of the invention;

FIG. 7 represents the scheme of the conductors of the capacitive block illustrated in FIG. 1 and of insulating films according to another embodiment of the invention.

It should be noted that the figures set out the invention in further detail to implement the invention, wherein said figures can of course be used to better define the invention if need be.

DETAILED DESCRIPTION

In the description that will be made hereinafter, the invention will be described in particular in the context of an electrical equipment, such as a power inverter, for an electric or hybrid automobile vehicle without limiting the scope of the present invention thereto.

Indeed, in an electric or hybrid automobile vehicle, the high voltage power battery provides the electric power supply function of the electric motor system, allowing vehicle drive, in particular via a power inverter enabling the DC current provided by the high voltage power battery to be converted into one or more AC, for example sinusoidal, control currents.

In reference to FIG. 1, the electrical equipment comprises a housing, which is dedicated. In the present case, this electrical equipment is a power inverter. The power inverter comprises a capacitive block 12 comprising a casing 10 adapted to be inserted in the housing. The capacitive block 12 also comprises a cavity 11, located inside the casing 10, in particular defined by the housing 10. The capacitive block 12 further comprises capacitive elements 121, 122, adapted to be inserted in the cavity 11 of the casing 10. The capacitive block 12 enables the DC current provided by the power battery to be smoothed, before being converted into an AC control current. This capacitive block 12 comprises a positive terminal and a negative terminal, thus enabling residual disturbances of the DC current to be removed in order to be filtered and converted into an AC control current, in particular by electronic switches not represented. The capacitive elements 121, 122 are for example chemical capacitors or film capacitors, or any other type of capacitive element.

In reference to FIGS. 1 and 2, the capacitive block 12 also comprises at least two conductors C1, C2, disposed along distinct parallel planes, yet in proximity of each other. In particular, the conductors C1, C2 are superimposed with each other. A first conductor C1 is connected to the respective negative terminals of the capacitive elements 121, 122 of the capacitive block 12. A second conductor C2 is connected to the respective positive terminals of the capacitive elements 121, 122 of the capacitive block 12. To that end, the capacitive block 12 can comprise first welds S1 enabling the first conductor C1 and the negative terminals of the capacitive elements 121, 122 to be connected. In FIG. 1, the first conductor C1 is for example welded to a face of the first capacitive element 121. A portion of the first conductor C1 passes between the capacitive elements 121, 122 to be connected to an opposite face of the second capacitive element 122. Likewise, the capacitive block 12 can comprise second welds S2 enabling the second conductor C2 and the positive terminals of the capacitive elements 121, 122 to be connected. In FIG. 1, the second conductor C2 is for example welded to a face of the second capacitive element 122. A portion of the second conductor C2 passes between the capacitive elements 121, 122 to be connected to an opposite face of the first capacitive element 121.

In addition, the conductors C1, C2 are also located in proximity of a wall P1 of said housing of the electrical equipment or in proximity of other components that can be located in said housing of the electrical equipment. For example, as illustrated in FIG. 6, the electrical equipment 1, herein a power inverter, comprises in particular a capacitive block 12 and a power electronic module 13 separated by a cooling circuit 14. In addition, the first conductor C1 is in proximity of a wall P1 of the housing 100. Said wall P1 is included in particular in a face of the cooling circuit 14 for cooling components of the electrical equipment 1, in particular the capacitive block 12.

In reference to FIG. 2, each conductor C1, C2 respectively comprises at least one connection terminal C10, C20 enabling the negative and positive terminals of the capacitive block 12 to be connected to the rest of the system in order in particular to feed electric power to the electric motor system. For example, the connection terminals C10, C20 of the conductors C1, C2 are connected to terminals of a power electronic module 13.

The connection terminals C10, C20 can for example designate a portion of the conductors C1, C2. In order to feed electric power to other components, these portions are for example pierced with one or more ports, in which a connector is screwed. These portions can be connected to the connector by other means, for example by welding.

In reference to FIGS. 3 and 4 in order to electrically insulate the conductors C1, C2 of the housing 100 and thus avoid any short-circuit, the capacitive block 12 comprises a first insulating film F1 placed against the conductor, among the at least two conductors C1, C2, the closest to the housing 100, so as to electrically insulate this conductor from the rest of the housing 100. In the embodiment shown in reference to FIGS. 3 and 4, the first insulating film F1 is placed against the wall of the first conductor C1. The first insulating film F1 includes at least one protrusion $F_{10}$ and at least one holding member F1-1 allowing holding of said first insulating film F1 against the surface of the first conductor C1.

Said protrusion $F_{10}$ designates a part projecting from the first insulating film F1. This protrusion $F_{10}$ is configured to extend in the cavity 11 of the casing 10 in order to be embedded and attached in the filling material of the cavity 11 of the casing 10. In addition, the at least one holding member F1-1 designates another part projecting from the first insulating film F1, placed for example at an opposite edge of the first insulating film F1 with respect to the at least one protrusion $F_{10}$. The holding member F1-1 is attached to a mechanical element of the capacitive block 12. Thus, the first insulating film F1 is held on a first edge by the holding member F1-1 and to its opposite edge by the protrusion $F_{10}$, which improves its mechanical holding. In particular, the adhesive material to hold the first insulating film F1 against the surface of the first conductor C1 can be dispensed with. This is in particular the case when the first insulating film F1 is rigid enough to be folded before mounting to said first conductor C1 and preserve its shape once it is mounted to said first conductor C1. Thus, the useful time of an adhesive material does not impact service life of the capacitive block 12.

In particular, still in reference to FIGS. 3 and 4, said mechanical element is a second insulating film F2, inserted between said conductors C1, C2 and extending up into the cavity 11 of the casing 10. In other words, the second insulating film F2 is held by being sandwiched between both conductors C1, C2 of the capacitive block 12. Said second insulating film F2 is configured to insulate said conductors C1, C2 from each other and avoid any short-circuit therebetween. Further, this second insulating film F2 forms the mechanical element with which the first insulating film F1 is attached. Said second insulating film F2 also includes at least one protrusion $F_{20}$ and at least one holding member F2-1.

Said protrusion $F_{20}$ designates a part projecting from the second insulating film F2. This protrusion $F_{20}$ is configured to extend in the cavity 11 of the casing 10 in order to be embedded and attached in the filling material of the cavity 11 of the casing 10. In addition, the at least one holding member F2-1 designates another part projecting from the second insulating film F2, adapted to be placed facing a holding member F1-1 of the first insulating film F1.

The first insulating film F1 and the second insulating film F2 are in particular made of plastic material.

In particular, said filling material is a fluid upon filling the cavity 11 of the casing 10, and then becomes a solid after a polymerisation step. In particular, the filling material is a polymerisable substance, such as a polymerisable resin, for example, in particular an epoxy resin.

The at least one holding member F1-1 of the first insulating film F1 and the at least one holding member F2-1 of the second insulating film F2 are configured to be attached to each other, by any suitable plastic welding means and in particular by using an ultrasound welding process.

Thus, attachment and holding the first insulating film F1 and the second insulating film F2 are ensured on the one hand by the protrusions $F_{10}$, $F_{20}$ extending in the filling material and on the other hand, by the weld made between the holding members F1-1, F2-1.

In reference to FIG. 5, the first insulating film F1 and the second insulating film F2 are shown alone, as well as their respective protrusions $F_{10}$, $F_{20}$ and their respective holding members F1-1, F2-1.

Instead of being attached to the second insulating film F2, the first insulating film F1 could be attached to another mechanical element, in particular of the electrical equipment 1. Thus, the mechanical element could be a wall P2 of the housing, as illustrated for example in FIG. 7. This wall P2 could alternatively be a surface of another electronic component of the electrical equipment 1.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electrical device comprising:
   a casing comprising a cavity receiving an electronic component, and at least one first electrical conductor connected to the electronic component so as to supply it with electric power,
   wherein said electrical device comprises a first electrically insulating film being against a surface of the first conductor so as to electrically insulate it, said first insulating film having at least one holding member enabling the first insulating film to be attached to a mechanical element, in particular of the electrical device.

2. The electrical device according to claim 1, comprising a second electrical conductor connected to the electronic component so as to supply it with electric power, the first and second electrical conductors being superimposed with each other and extending along two distinct parallel planes, and wherein the mechanical element is a second insulating film positioned between the conductors so as to insulate the first and the second conductor from each other.

3. The electrical device according to claim 2, wherein the second insulating film comprises at least one holding member adapted to be attached to the holding member of the first insulating film.

4. The electrical device according to claim 2, wherein the second insulating film has at least one protrusion inserting in the cavity of the casing to be embedded in a filling material of the cavity of the casing, said protrusion being located at an opposite edge of the second insulating film with respect to the holding member.

5. The electrical device according to claim 4, wherein the first insulating film has at least one protrusion inserting in the cavity of the casing to be embedded in a filling material of the cavity of the casing, said protrusion being located at an opposite edge of the first insulating film with respect to the holding member.

6. The electrical device according to claim 5, wherein the first insulating film is of plastics.

7. The electrical device according to claim 6, wherein the first insulating film is held by a first mechanical means, for example an adhesive material, against the surface of the first conductor and by a second mechanical means with a different nature, for example by welding, on the mechanical element.

8. The electrical device according to claim 5, wherein the first insulating film has at least one fold so as to fit in the surface of the first conductor and is held against said surface of the first conductor only by the first holding member and by the protrusion.

9. An electrical equipment comprising a housing and an electrical device, according to claim 3, housed in said housing, in which electrical equipment, said first insulating film is configured to electrically insulate the first conductor from a wall of said housing of the electrical equipment or other components of the electrical equipment located in said housing of the electrical equipment, said second electrically insulating film being configured to insulate the conductors from each other.

10. The electrical equipment according to claim 9, configured to be onboard a vehicle, and forming a power inverter configured so as to supply an electric motor driving the vehicle from a battery, or a DC-DC converter configured to convert a voltage between a high voltage power battery and a low voltage power battery, or an electrical charger configured to convert a voltage between an electric power grid external to the vehicle and a battery of the vehicle.

11. The electrical device according to claim 3, wherein the second insulating film has at least one protrusion inserting in the cavity of the casing to be embedded in a filling material of the cavity of the casing, said protrusion being located at an opposite edge of the second insulating film with respect to the holding member.

12. The electrical device according to claim 6, wherein the first insulating film has at least one fold so as to fit in the surface of the first conductor and is held against said surface of the first conductor only by the first holding member and by the protrusion.

13. The electrical device according to claim 7, wherein the first insulating film has at least one fold so as to fit in the surface of the first conductor and is held against said surface of the first conductor only by the first holding member and by the protrusion.

14. The electrical device according to claim 1, wherein the first insulating film has at least one protrusion inserting in the cavity of the casing to be embedded in a filling material of the cavity of the casing, said protrusion being located at an opposite edge of the first insulating film with respect to the holding member.

15. The electrical device according to claim 2, wherein the first insulating film has at least one protrusion inserting in the cavity of the casing to be embedded in a filling material of the cavity of the casing, said protrusion being located at an opposite edge of the first insulating film with respect to the holding member.

16. The electrical device according to claim 3, wherein the first insulating film has at least one protrusion inserting in the cavity of the casing to be embedded in a filling material of the cavity of the casing, said protrusion being located at an opposite edge of the first insulating film with respect to the holding member.

17. The electrical device according to claim 1, wherein the first insulating film is of plastics.

18. The electrical device according to claim 2, wherein the first insulating film is of plastics.

19. The electrical device according to claim 3, wherein the first insulating film is of plastics.

20. The electrical device according to claim 4, wherein the first insulating film is of plastics.

* * * * *